United States Patent [19]
Schneider

[11] Patent Number: 6,052,033
[45] Date of Patent: Apr. 18, 2000

[54] RADIO FREQUENCY AMPLIFIER SYSTEM AND METHOD

[75] Inventor: Gerhard Schneider, Mex, Switzerland

[73] Assignee: Logitech, Inc., Fremont, Calif.

[21] Appl. No.: 09/163,737

[22] Filed: Sep. 30, 1998

[51] Int. Cl.[7] ....................................................... H03F 3/04

[52] U.S. Cl. ........................ 330/302; 330/51; 455/234.1

[58] Field of Search ...................................... 330/302, 303, 330/305, 306, 51; 455/234.1, 239.1, 252.1

[56] References Cited

U.S. PATENT DOCUMENTS

| | | | |
|---|---|---|---|
| 5,130,669 | 7/1992 | Wignot et al. | 330/306 |
| 5,146,178 | 9/1992 | Nojima et al. | 330/251 |
| 5,241,284 | 8/1993 | Nyqvist et al. | 330/297 |
| 5,434,540 | 7/1995 | Yamamoto et al. | 330/251 |
| 5,726,606 | 3/1998 | Marland | 330/302 |

OTHER PUBLICATIONS

Bowick, C., "RF Circuit Design," SAMS. First Edition, Chapter 7, pp. 150–160, 1994. No month.
Hardy, J., "High Frequency Circuit Design," Prentice Hall, Chapter 9, pp. 288–293, 1979. No month.
Krauss, H. L., Bostian, C. W., Raab, F. H., "Solid State Radio Engineering," John Wiley & Sons, Inc., Chapter 13, pp. 394–417. No month and no year.

*Primary Examiner*—Robert Pascal
*Assistant Examiner*—Henry Choe
*Attorney, Agent, or Firm*—Fenwick & West LLP

[57] ABSTRACT

A low-voltage power amplifier system achieves high efficiency with a low power supply and a low input voltage. The low-voltage power amplifier system includes an enable input for switching the system between an ON state and an OFF state. The low-voltage power amplifier system can directly amplify the input signal and can achieve a frequency multiplication by an even factor. The low-voltage power amplifier system includes a biasing capacitor, a biasing resistor, a npn or pnp transistor, an output or resonant inductor, an output or resonant capacitor, and an optional stability resistor.

14 Claims, 6 Drawing Sheets

RADIO FREQUENCY AMPLIFIER SYSTEM AND METHOD

BACKGROUND OF THE INVENTION

1. Field of the Invention

The present invention is related to amplifier systems, and more particularly, to radio-frequency amplifier systems.

2. Description of the Related Art

Radio frequency ("RF") amplifier circuits for use in RF transmitters are known. Conventional RF amplifier circuits generate RF signals and may be coupled with an antenna so that the antenna can transmit the RF signals. Conventional RF amplifier circuits typically use class C amplifiers to obtain maximum efficiency. Efficiency is defined by the ratio of output power to the supplied power. Class C amplifiers are theoretically 100% efficient and are, therefore, popular for use in products where power consumption and battery longevity is an important criteria, such as in wireless products.

FIG. 1 is a circuit diagram illustrating a conventional class C amplifier 101. A class C amplifier typically includes a capacitance 110, a resistor 120, a transistor 130 having a base, a collector, and an emitter, a supply voltage 150, a ground, an output signal line 170, and an LC circuit 175 that includes an inductor 175a and a capacitor 175b. An input voltage source 105 with a source resistance 105a provides the RF signal to the amplifier.

The input voltage source 105, with its source resistor 105a is coupled to the capacitance 110 and the ground 160. The capacitance 110 is coupled to the resistance 120 and the base of the transistor 130. The resistance 120 is coupled to the base of the transistor 130 and the ground 160. The emitter of the transistor 130 is coupled to ground 160 and the collector of the transistor 130 is coupled to the LC circuit 175, which is coupled to the supply voltage 150. An amplified signal is output through the output signal line 170 that is coupled to the collector of the transistor 130.

During operation of the conventional amplifier circuit 101, the input voltage source 105 is typically a sinusoidal input of 3.0 volts or greater, peak-to-peak. The resistance 120 is used to adjust the conduction angle of the transistor. Due to the non-linearity of the base-emitter junction of the transistor and capacitor 110, the transistor is automatically negative-biased, and therefore, not amplifying. The base resistor 120 reduces this negative bias during each input signal period and opens the transistor for a small amount of time each period. This time, expressed in degrees, called a conduction angle. The transistor works only during the conduction angle.

For low voltage applications (typically 3 volts or less), where the input signal is also low, this self-biasing process could not happen properly. First, the input signal could be too low (lower than 1.4 volt peak-to-peak ("$V_{pp}$")) for exceeding the base-emitter junction voltage ($V_{be}$=0.7 volts) of the transistor, and therefore, is unable to open the transistor. Second, even if the input signal was slightly higher, and therefore, able to exceed the $V_{be}$ voltage, the resulting negative bias would be too low. The base resistor must be very low to correctly adjust the conduction angle of the transistor; this however, has the effect of dramatically decreasing the performance of the class C amplifier. Thus, class C amplifiers are not suitable for low voltage designs and applications.

A wireless product, for example an RF wireless keyboard, requires an increased transmission range in order to realize its wireless advantages. Therefore, the radiation power of the amplified signal must be strong enough to provide these advantages. Moreover, a wireless RF product runs on batteries and requires low power consumption to increase battery lifetime. Conventional amplifiers (class A) which are able to work at low voltages, however, are not optimal for such applications because of their low efficiency. That is, only a small portion of the energy drawn from the battery is provided to an antenna of a wireless RF keyboard, while the remaining portion is wasted.

Therefore, there is a need for (1) a high efficiency RF amplifier system that (2) provides adequate signal strength for longer transmission ranges, but (3) that has low power consumption while (4) being low cost to achieve and (5) works at low supply voltage.

SUMMARY OF THE INVENTION

The present invention includes a low-voltage power amplifier system for a radio frequency ("RF") transmitter system. The low-voltage power amplifier system includes inputs from, for example, an enable system, an input system, and a power supply system. The low-voltage power amplifier system also includes, for example, an output system.

The input system may be coupled to the low power amplifier system input, to provide an RF signal to be amplified. The enable system may be coupled to an "Enable" input of the low-power amplifier system to provide a control function, for example, placing the low-voltage power amplifier system in an ON/working state or OFF/not working state.

The power supply system may be coupled to, for example, "Vcc" input, which supplies the low-power amplifier system with a voltage that could be, for example, two battery cells of 1.5 volts each. The two battery cells may provide a voltage level of 3.5 volts (e.g., new batteries) down to 1.6 volts (e.g., end of battery life). The output system may be coupled to the output of the low-power amplifier system. The output system may include an impedance matching network and an antenna for transmitting the amplified RF signal generated through the low-voltage power amplifier system.

The low-voltage power amplifier system includes a resonant filter subsystem, a voltage supply rail, a biasing subsystem, and an amplifier transistor that includes a base, a collector, and an emitter. The resonant filter subsystem is coupled to the voltage supply rail and the collector of the amplifier transistor. The voltage supply rail may be coupled with the power supply system. The biasing subsystem is coupled to the base of the transistor. The emitter of the amplifier transistor is coupled to ground.

The resonant filter subsystem includes a resonance inductor and a resonance capacitor. The resonance inductor is coupled to the resonance capacitor in parallel. Both the resonance inductor and the resonance capacitor are coupled to the voltage supply rail at a first end and to the collector of the amplifier transistor at a second end. In a preferred embodiment, a resistor could be placed in series or in parallel to the inductor or the capacitor, in order to reduce the quality factor for preventing some unwanted parasite oscillations.

The biasing subsystem includes a capacitor and a resistor. The capacitor is coupled to the input system at the first end, and to the resistor and the base of the transistor at the second end. The resistor is coupled to the enable system at the first end, and to the capacitor and the base of the transistor at the second end.

In a preferred embodiment, the amplifier transistor is a bipolar junction transistor that is a npn or pnp transistor. Also, in a preferred embodiment the input voltage source is an oscillator or modulator subsystem that generates a signal that could be as low as 1.0 volts peak-to-peak (or even lower, for example, substantially zero). Further, in a preferred embodiment the voltage supply rail is Vcc and generates a voltage that could be as low as 2.0 volts (or even lower). Moreover, in a preferred embodiment the enable signal may be an output of a microprocessor.

During operation of the present invention, the input voltage subsystem is a low voltage source so that it is too small for biasing properly the transistor in class C mode because this input voltage could be less than the transistor threshold voltage $V_{be}$=0.7 volts. To place the transistor in an ON state, the base voltage must exceed this threshold voltage. If the enable system is set to a logical high voltage (e.g., Vcc), the slight current flowing through the resistor of the biasing subsystem, is slightly biasing the transistor around the threshold voltage.

Once an input signal is applied to the "Input" of the low-voltage power amplifier system, the voltage is now high enough to exceed the threshold voltage, and the negative biasing process now occurs. This is true even with a small input voltage signal that is smaller than the threshold voltage, and may be as low as, for example, 1.0 volts peak-to-peak (or even lower, for example, substantially zero).

The resonance filter subsystem enhances the gain of the amplifier transistor by providing a resonance frequency at an operating frequency and simultaneously suppressing the unwanted harmonics of the amplified output signal. In a preferred embodiment, the resonance filter could be either adjusted to the input frequency or to an even multiple (2, 4, 6, etc. . . . ) of the input signal in order to multiply the input frequency. For example, the system may use a 13.5 MHz input signal and a 27 MHz output signal. The amplified output signal fed to the output subsystem goes usually through a impedance matching network before being coupled to the antenna for transmission.

The present invention advantageously uses an enable signal to control a state (ON or OFF) of a low-voltage power amplifier system. By controlling the state of the low-voltage power amplifier system, the present invention allows for the amplifier transistor to operate with maximum efficiency using a low-voltage power supply and low-voltage input source. Further, the present invention is also self biasing, and therefore, provides a stabilized operating point with respect to collector current. The biasing subsystem will automatically bias the transistor even with input signal amplitudes as low as 1.0 volt peak-to-peak (or even lower).

The biasing subsystem of the present invention beneficially allows for efficiencies higher than 60% for a low voltage and low input signal amplitude amplifier. Additionally, the resistor of the biasing subsystem could be used directly for getting the enable function without additional cost impact. Thus, the present invention reduces power consumption while providing a strong, amplified RF signal.

The features and advantages described in the specification are not all inclusive and, in particular, many additional features and advantages will be apparent to one of ordinary skill in the art in view of the drawings, specification, and claims. Moreover, it should be noted that the language used in the specification has been principally selected for readability and instructional purposes, and may not have been selected to delineate or circumscribe the inventive subject matter.

DETAILED DESCRIPTION OF THE PREFERRED EMBODIMENTS

A preferred embodiment of the present invention will be described with reference to the Figures, where like reference numbers may indicate identical or functionally similar elements. The present invention includes a low-voltage, low-power consumption, efficient, amplifier system for use in transmitting radio frequency ("RF") signals.

Figure 1:
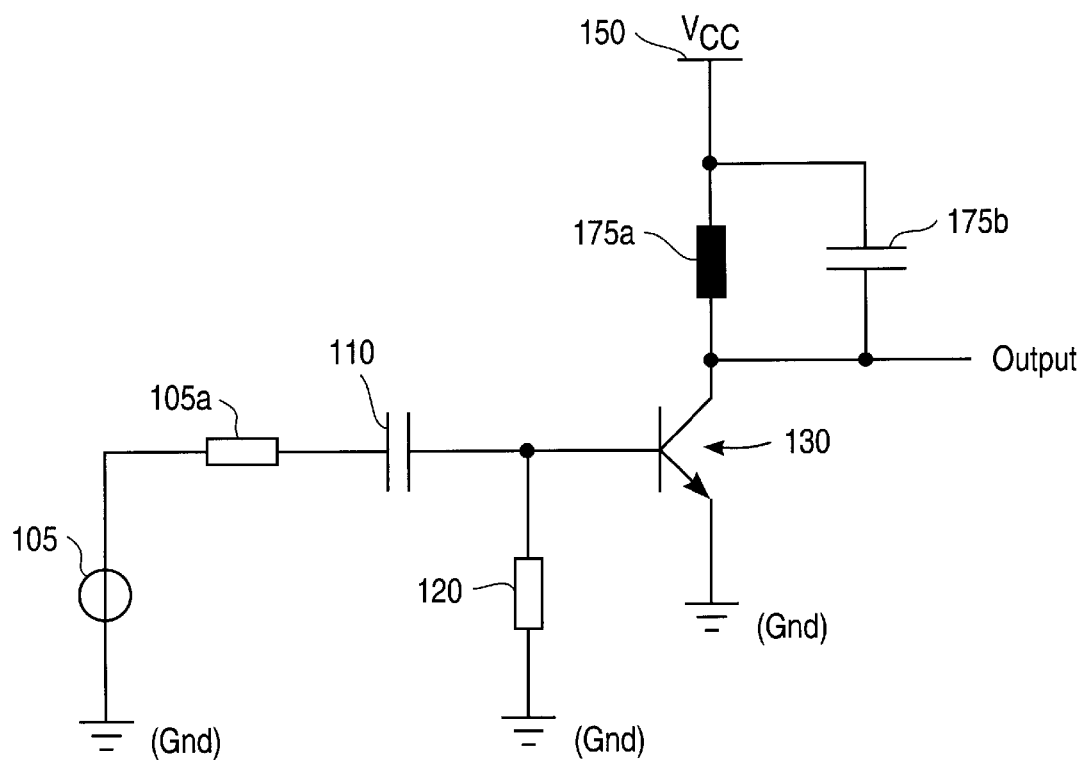
FIG. 1 is a prior art circuit diagram of a conventional class C amplifier circuit.
Figure 2:
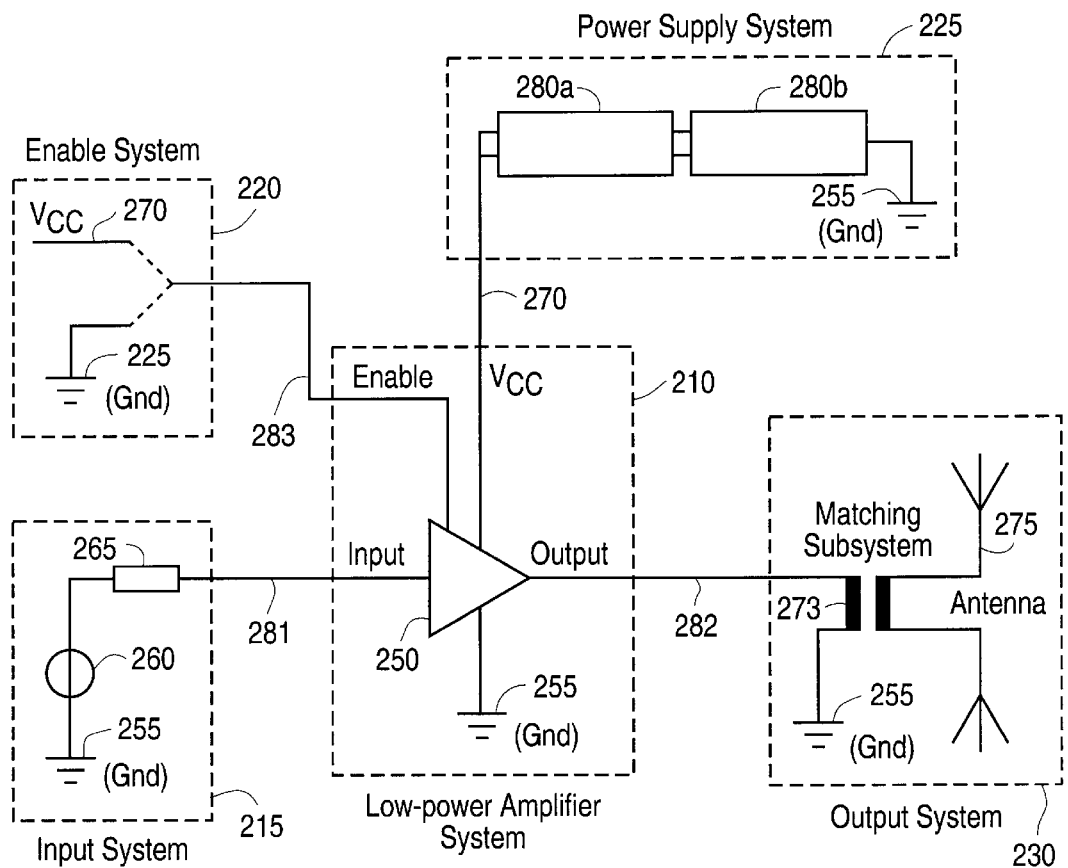
FIG. 2 is a circuit diagram illustrating one-embodiment of a radio-frequency ("RF") transmitter system, including a low-voltage power amplifier system, in accordance with the present invention.

FIG. 2 illustrates one-embodiment of a RF transmitter system 205, including a low-voltage power amplifier system, in accordance with the present invention. The RF transmitter system 205 includes a first embodiment of a low-voltage power amplifier system 210, an input system 215, an enable system 220, a power supply system 225, and an output system 230. The first embodiment of the low-voltage power amplifier system 210 is coupled to the input system 215, the enable system 220, the power supply system 225, and the output system 230.

Generally, the input system 215 may be represented by a voltage source 260 and a resistor 265. Moreover, the input system 215 is typically an oscillator that generates a sinusoidal-like signal to the low-voltage amplifier system 210 along an input signal line 281. In one embodiment the input RF signal that will be amplified and transmitted is, for example, between 0.5 volts (or even lower, for example, substantially zero) and 2.0 volts peak-to-peak (or higher), depending on whether the batteries are empty or full.

The enable system 220 includes a switch that may be toggled between a voltage supply rail Vcc 270 and the ground 255. The voltage supply rail Vcc 270 may have a voltage of, for example, 1.6 volts to 3.5 volts (empty batteries to full batteries). When the switch of the enable system 220 is toggled to Vcc, an enable signal is sent to the low-voltage power amplifier system 210 along an enable signal line 283. The enable signal allows the low-voltage power amplifier system 210 to be in an ON state. When the switch of the enable system 220 is toggled to the ground 255 no signal is sent to the low-voltage power amplifier system 210 and the low-voltage power amplifier system 210 may be disabled or in an OFF state.

The power supply system 225 includes a power source, e.g., 280a, 280b, that is coupled to the ground 255 and to the low-power amplifier system 210. The power source may be, for example, one or more battery cells, solar cells, direct current component of an alternating current source, or other power producing device or apparatus. For example, the power source may be two 1.5 volt batteries. The power source, e.g. 280a, 280b, may be used to supply the Vcc power rail 270.

The output system 230 includes a impedance matching subsystem 273 and an antenna 275. The impedance matching subsystem 273 is coupled to the ground 255 and the low-power amplifier system 210. It is noted that the impedance matching subsystem 273 may be a regular impedance matching network between the amplifier output signal line 282 and the antenna 275. Moreover, impedance matching subsystem 273 may be optional.

When the antenna 275 receives an amplified RF signal from the low-power voltage amplifier system 210 through amplifier output signal line 282, the amplified RF signal is transferred with optimal efficiency through the impedance matching subsystem 273 to the antenna 270 for transmission. It is noted that the transmission of the amplified RF signal occurs through conventional RF transmission principles. In one embodiment, the RF signal is an output signal transmitted as a 27 MHz output, or amplified RF, signal.

An advantage of the RF transmitter system 205, including the low-power amplifier system 210, is that RF signals may be transmitted with maximal efficiency. For example, the present invention transmits high quality RF signals and generates the output signal through reduced power consumption, thereby, increasing system efficiency and operation times.

Figure 3A:
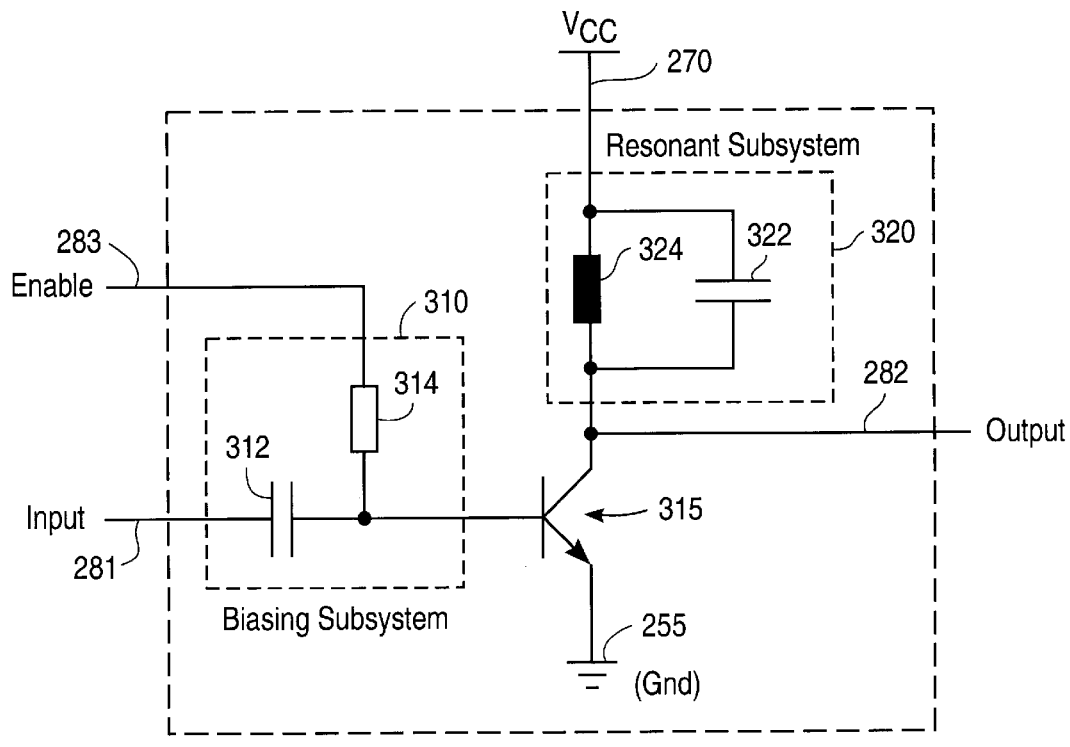
FIG. 3a is a circuit diagram illustrating a first embodiment of the low-voltage power amplifier system in accordance with the present invention.
Figure 4A:
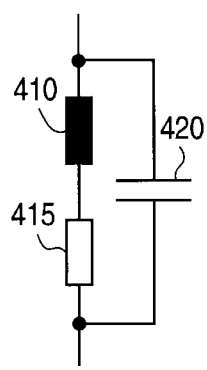
FIGS. 4a, 4b, 4c, and 4d are circuit diagrams illustrating a second, a third, a fourth, and a fifth embodiment for a resonant subsystem in accordance with the present invention.
Figure 4B:
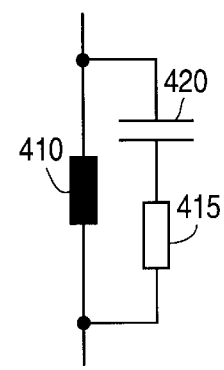
Figure 4C:
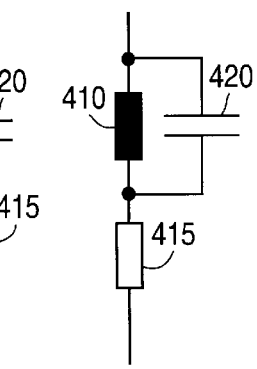
Figure 4D:
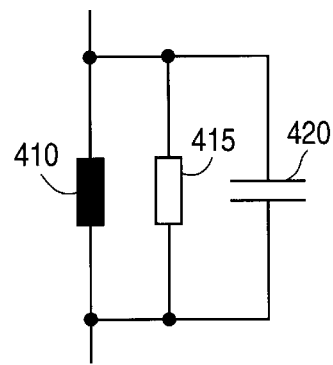

FIG. 3a is a block diagram of the first-embodiment of the low-voltage power amplifier system 210 in accordance with the present invention. The low-voltage power amplifier system 210 includes, for example, three inputs: the input signal line 281, the enable signal line 283, and the power source signal line 270. The low-voltage power amplifier system 210 also includes, for example, one output: the output signal line 282. The low-power amplifier system 210 includes a biasing subsystem 310, a resonant subsystem 320, and transistor 315.

The transistor 315 includes a base, an emitter, and a collector. The transistor 315 may be an npn transistor (or a pnp transistor as illustrated in a second embodiment of the low-voltage power amplifier system shown in FIG. 3b). The biasing subsystem 310 is coupled to receive the input signal line 281, the enable signal line 283, and the base of the transistor 315. The resonant subsystem 320 is coupled to the voltage supply rail Vcc 270, the amplifier signal output line 282 and the collector of the transistor 315. The emitter of the transistor 315 is coupled to the ground 255.

As described above, the low-power amplifier system 210 receives, for example, an input signal between 0.5 volts (or even lower, for example, substantially zero) and 2.0 volts (or higher) peak-to-peak, depending on whether the batteries are empty or full. The input signal is transmitted along the input signal line 281. The peak-to-peak voltage signal will be amplified by the amplifier system 210 for transmission as is further described below. The "Enable" signal from the enable system 220 is input into the low-power amplifier system 210 along the enable signal line and is used to switch the amplifier ON (for transmitting a RF signal) or OFF (disable or power saving mode).

If the "Enable" input is pulled to ground (0 volts), the low-voltage power amplifier system 210 may be disabled. If the "Enable" input is pulled to Vcc, the low-voltage power amplifier system 210 may be operational and amplifying the input signal. Also as discussed above, the low-voltage power amplifier system 210 generates the amplified RF signal from the input signal when the low-voltage power amplifier system 210 is enabled. The amplified RF signal is transmitted along the output signal line 282 to the output system 230 for transmission.

Thus, if the "Enable" input signal is may be used for frequency modulation of the amplified RF output signal by keeping the low-voltage power amplifier system in a continuously ON state, and modulating the oscillator for transmitting data via the amplified RF output signal. Alternatively, the "Enable" input signal may also be used for amplitude modulation of the amplified RF output signal by appropriately switching the low-voltage power amplifier system 210 between ON and OFF as the data is sent for transmission.

Looking closer at the low-voltage power amplifier system 210, the resonant subsystem 320 includes a resonance inductor 324 and a resonance capacitor 322. The resonance inductor 324 and the resonance capacitor 322 are coupled together in parallel and are coupled at one end to the voltage supply rail Vcc 270 and at the other end to the collector of the transistor 315 and the amplifier output signal line 282. The biasing subsystem 310 includes a capacitor 312 and a resistor 314. One end of the capacitor 312 is coupled with the input signal line 281 and the other end of the capacitor 312 is coupled to one end of the resistor 314 and the base of the transistor 315. The other end of the resistor 314 is coupled to the enable signal line 283.

The resonant subsystem 320 is tuned to the output frequency. The output frequency may be the same as the input frequency or an even multiple of the input frequency. The resonant subsystem 320 may be used to achieve a high gain at the output frequency, while reducing all the other unwanted harmonics and sub-harmonics.

The biasing subsystem 310 automatically biases the transistor. The biasing subsystem 310 advantageously biases the transistor even with input signal amplitudes as low as 1.0 volt peak-to-peak (or even lower). Further, the biasing subsystem 310 advantageously allows for efficiencies higher than 60% for a low voltage and low input signal amplitude. Additionally, the resistor 314 of the biasing subsystem 310 could be used directly for getting the enable function without additional cost impact.

Figure 3B:
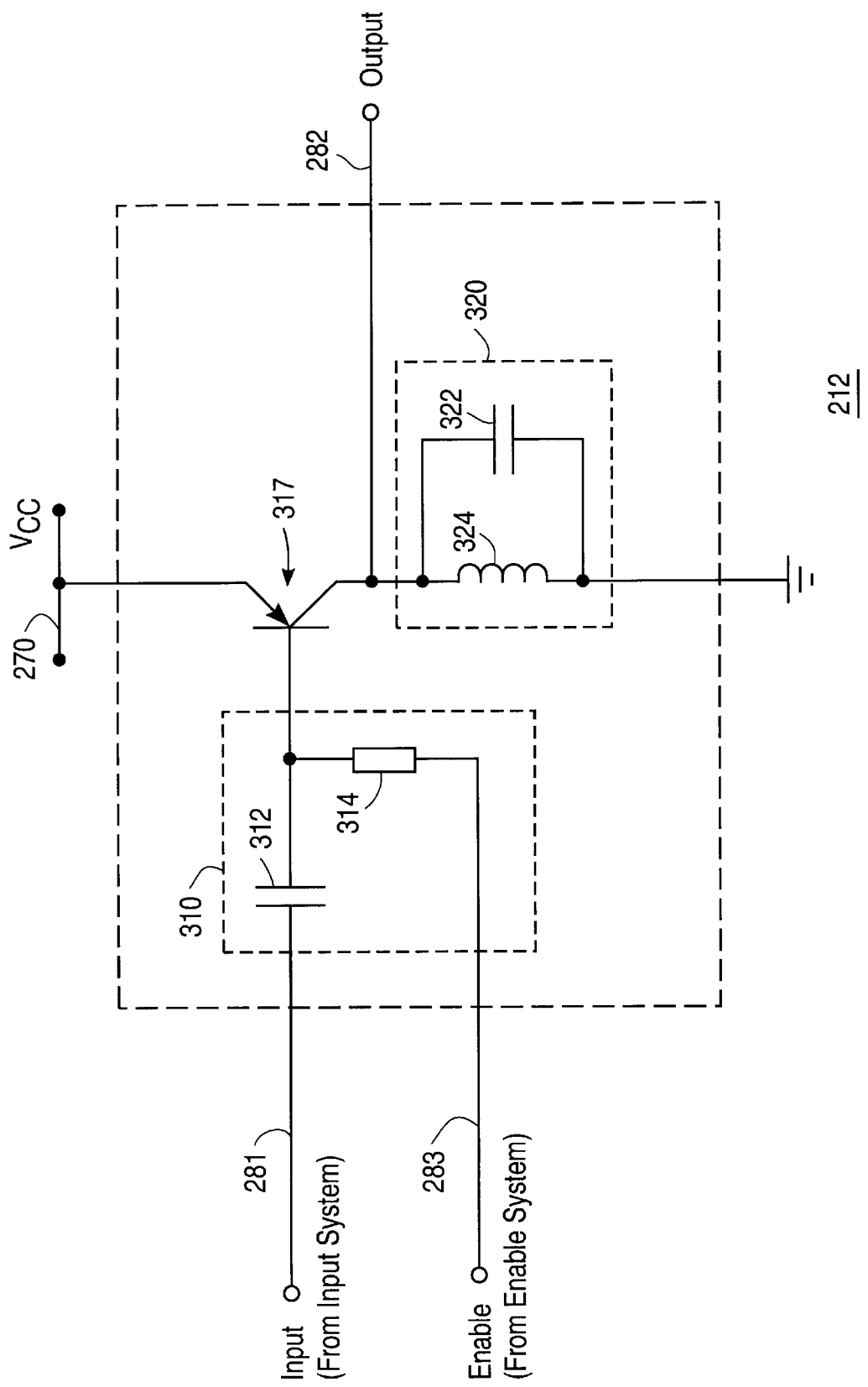
FIG. 3b is a circuit diagram illustrating a second embodiment of the low-voltage power amplifier system in accordance with the present invention.

FIG. 3b illustrates a second embodiment of a low-voltage power amplifier system 212 in accordance with the present invention. Generally, the principles of operation of the second embodiment 212 is similar to the first embodiment 210. The second embodiment 212 includes the biasing subsystem 310, the resonant subsystem 320, and a pnp transistor 317. In the second embodiment of the low-voltage power amplifier system 212, the polarity of the enable signal along the enable signal line 283 from the enable subsystem 220 is reversed. That is, when the switch of the enable subsystem 220 is toggled to Vcc, the amplifier system 206 is in the OFF state. When the switch of the enable system 220 is toggled to ground 255, the low-voltage power amplifier system 212 is in the ON state.

FIGS. 4a, 4b, 4c, and 4d illustrate additional embodiments for the resonant subsystem 320. These embodiments may be used, for example, if stability problems are encountered in the low-voltage power amplifier system 210, 212. Stability problems happen usually when several same amplifiers are placed in series, for example, when a higher gain and/or several frequency multiplications are required.

In a second embodiment (4a), the resonant subsystem 320 may include one resistor 410 and one inductor 415 in series with each other and in parallel with a capacitor 420. In a third embodiment (4b), the resonant subsystem 420 may include resistor 440 in series with a capacitor 420, and which together are in parallel with an inductor 415. In a fourth embodiment (4c), the resonant subsystem 320 may include an inductor 415 in parallel with a capacitor 420, which together are in series with a resistor 410. In a fifth embodiment (4d), the resonant subsystem 320 may include a resistor 410 in parallel with a capacitor 420, which together are in parallel with an inductor 415.

Figure 5:
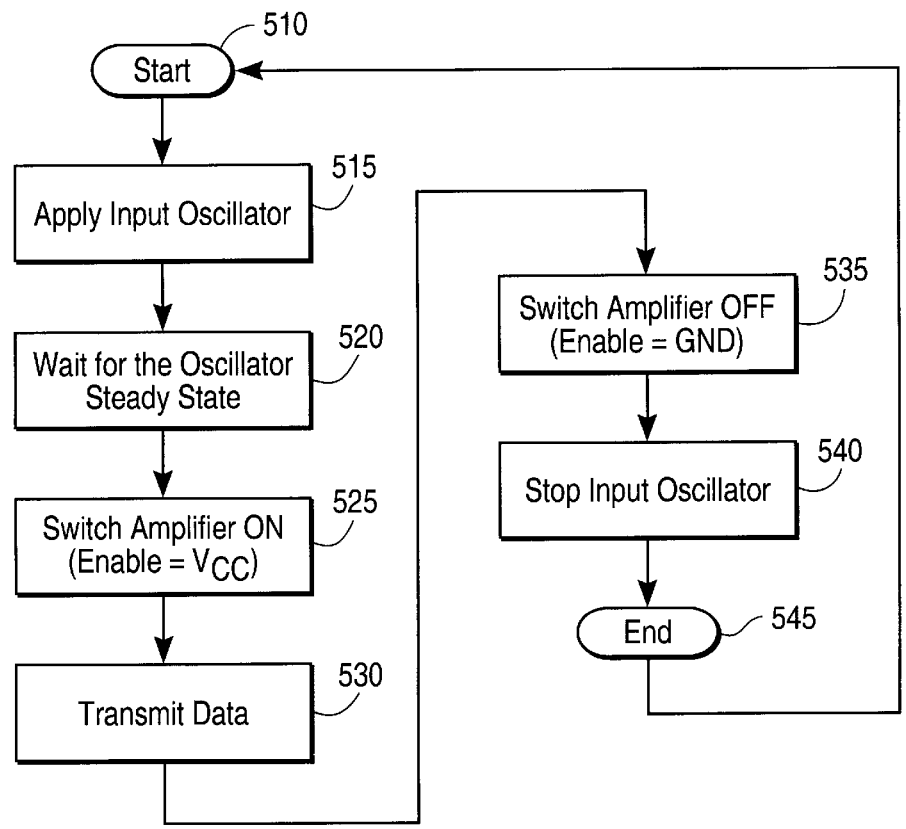
FIG. 5 is a flow diagram illustrating one-embodiment of operation of the low-voltage power amplifier system in accordance with the present invention.

FIG. 5 is a flow diagram illustrating one-embodiment for operation of the low-voltage power amplifier system 210, 212 in accordance with the present invention. The operation process starts 510 by applying 515 an input signal to the amplifier. The input signal may come from an oscillator, for example, the input oscillator 260. An oscillator may require a small amount of time to be stable in frequency and amplitude, and in such instances the process may wait 520 until the oscillator reaches a steady state before switching ON the amplifier. The wait time may be used by a microprocessor of a device, coupled with the RF transmitter system 205, to prepare the data to be transmitted. For a crystal oscillator, this waiting time is in the 1 millisecond to 5 millisecond range. If there is no strong request on output signal purity at the amplifier switch on, this waiting time could be reduced to 0.

Once the input signal is stable, the low-voltage power amplifier system e.g., 210, can be switched 525 "ON" by pulling the switch of the enable system 220 to "Enable" so that it is at Vcc. The RF transmitter system 205 is ready to transmit 530 the radio-frequency (RF) data. Once transmission of RF data is completed, the low-voltage power amplifier system e.g., 210, should be switched OFF by pulling the s witch of the enable system 220 to ground. After the low-power amplifier system e.g., 210, is switched off, the oscillator of the input system 215 may also be stopped 540 or switched "OFF." This ends 545 the process and returns the RF transmitter system 205 to a power saving mode. The process may be started again as described above whenever necessary.

Figure 6A:
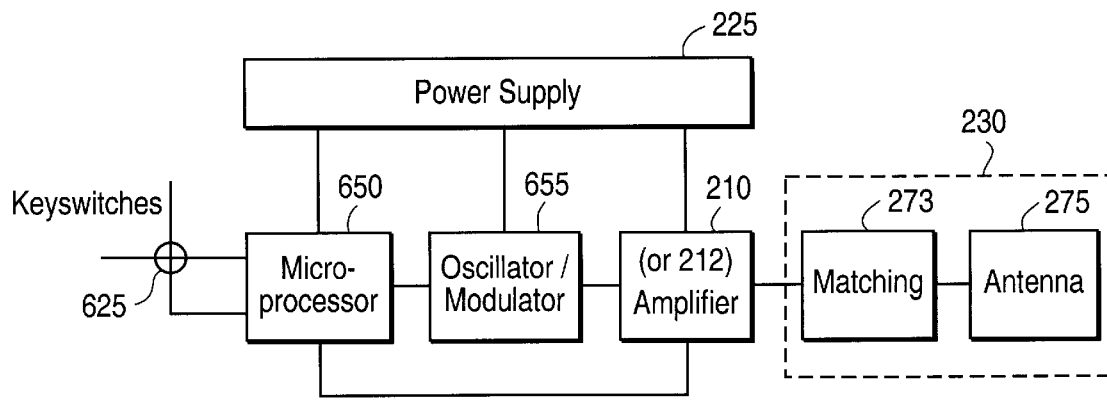
FIGS. 6a, 6b, 6c are block diagrams illustrating the low-voltage power amplifier system in electronic devices, for example, a wireless keyboard, a wireless mouse, or a wireless joystick device, in accordance with the present invention.
Figure 6B:
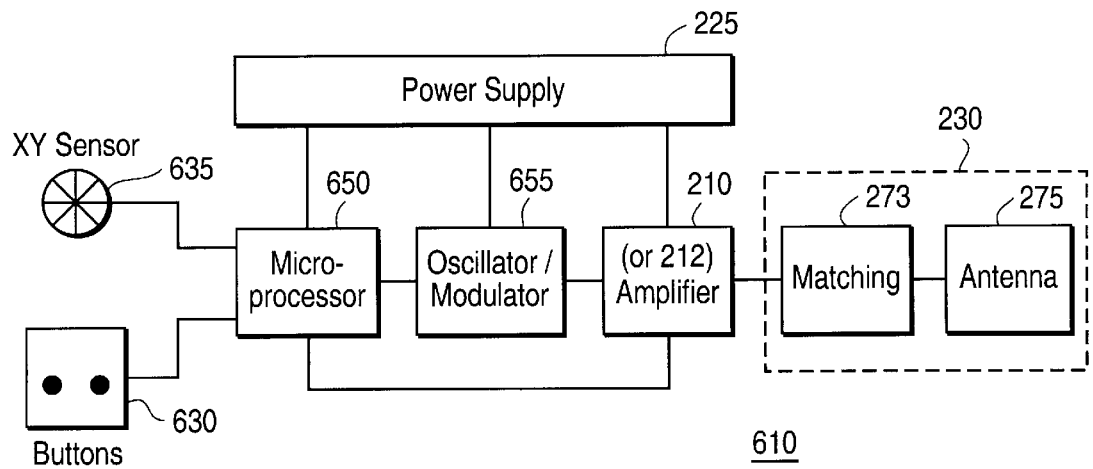
Figure 6C:
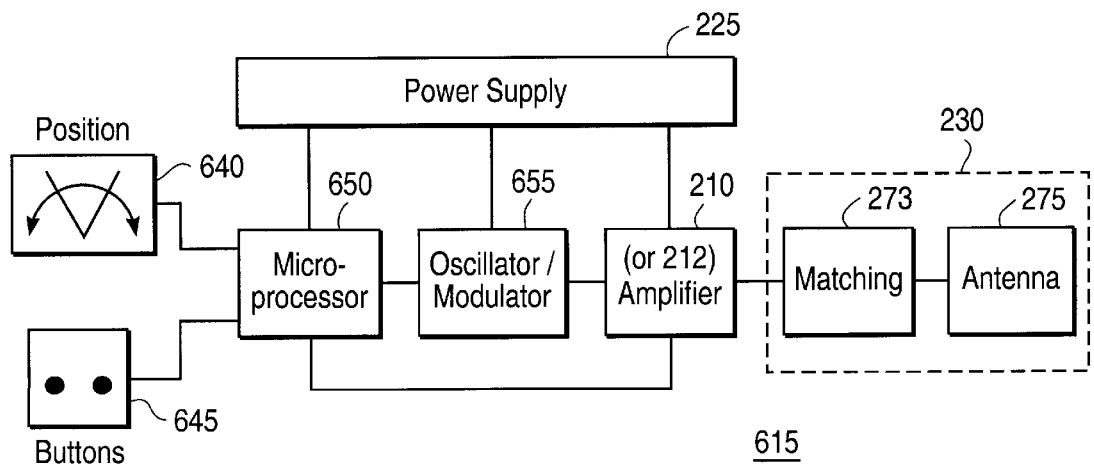

FIGS. 6a, 6b and 6c illustrate examples of one embodiment of a low-power amplifier system 210, 212 for use in battery powered wireless devices, for example, a keyboard, a mouse or a joystick. One skilled in the art will appreciate that the application field of the low-power amplifier system 210, 212 is not limited to the keyboard, the mouse, the joystick, and rather may be applied to a multitude of applications requiring transmission of an efficient, low-power consumption signal. Further, the low-voltage power amplifier system 210, 212 may be used for any transmitting device. Where low-voltage power and signal transmission efficiency would be beneficial.

FIG. 6a is a block diagram illustrating one embodiment of a wireless keyboard electronics system 605, including the low-voltage power amplifier system 210, 212, in accordance with the present invention. One embodiment of a wireless keyboard device is described in U.S. patent application Ser. No. 08/932,753 entitled "Antenna System and Apparatus for Radio-Frequency Wireless Keyboard," the relevant portions of which are hereby incorporated by reference.

FIG. 6b is a block diagram illustrating one embodiment of a wireless mouse electronics system 610, including the low-voltage power amplifier system 210, 212, for use in a wireless mouse in accordance with the present invention.

FIG. 6c is a block diagram illustrating one embodiment of a wireless joystick electronics system 615, including the low-voltage power amplifier system 210, 212 for use in a wireless joystick in accordance with the present invention.

Each of the wireless devices 605, 610, 615 in the example includes a microprocessor 650 or other instruction and control system, an oscillator/modulator 655 or other signal generation system, the power supply system 225 or other power source, the low-voltage power amplifier system 210, 212, and the output system 230 or other efficient antenna system. It is noted that the microprocessor 650 may function similar to the enable system 220 described above. Further, the oscillator/modulator 655 may function similar to the input system 215 described above.

Each wireless device 605, 610, 615 includes an input mechanism. For example, the wireless keyboard 605 may include keyswitches 625 associated with keys on a keyboard to indicate a key that is depressed or selected. The wireless mouse 610 may include a "XY" (x-axis, y-axis) sensor 635 and a button mechanism 630. The XY sensor 635 may be used, for example, positioning a cursor on a screen. The button mechanism 630 may be used, for example, making a selection or a screen such as selecting a radio button o n a computer application.

The wireless joystick 615 includes a position mechanism 640 and a button mechanism 645. The position mechanism 640 may be used, for example, positioning a target over an object on a screen in a computer game application. The button mechanism 645 may be used, for example, firing a shot at the object positioned the target in the computer game application.

Each input mechanism in each wireless device 605, 610, 615 is coupled to the microprocessor 650. The microprocessor 650 is coupled to the oscillator/modulator 655 and the low-voltage power amplifier system 210, 212. The oscillator/modulator 615 is coupled to the low-voltage power amplifier system 210, 212. The low-voltage power amplifier system 210, 212 is coupled to the output system 230. The power supply system 225 is coupled to, and provides power to, the microprocessor 650, the oscillator/modulator 655, and the low-voltage power amplifier system 210, 212.

In each of the wireless devices 605, 610, 615, the respective input mechanism 625, 630 and 635, 640 and 645 generates a signal, for example, a sensor signal. The sensor signal is, for example, any signal that is generated from, for example, sensors, encoders, decoders, switches, logic elements software, or any combination thereof. The sensor signal represents some action, for example, depressing a key on a keyboard, moving a cursor across a screen, or firing a missile at an object on a screen, depending on the input mechanism 625, 630 and 635, 640 and 645.

In each case where some action may be taken by the input mechanism 625, 630 and 635, 640 and 645, the sensor signal is input into the microprocessor 650. The microprocessor processes the sensor signal so that the oscillator/modulator 655 generates a respective modulated input RF signal. The input RF signal may be, for example, a 0.5 volts to 2.0 volts peak-to-peak signal such as that described above with the input system 215.

The microprocessor 650 also provides an enable signal, for example, the "Enable" signal described above with the enable system 220. If frequency modulation is used, the enable signal triggers the low-voltage power amplifier system 210, 212 to an ON state. The low-voltage power amplifier system 210, 212 receives the input RF signal from the oscillator/modulator 655 and processes the input RF signal as described above.

If amplitude modulation is used, the input signal may be unmodulated and the output signal may be amplitude modulated using the "Enable" input signal as described above. In amplitude modulation, the microprocessor may send the data signal directly to the "Enable" line rather than modulating the input oscillator.

The amplified RF signal is output to the output system 230. The output system may include the matching subsystem 273 to allow the antenna 275 to transmit the amplified RF signal using conventional antenna-signal propagation theories. The transmitted, or propagated, amplified RF signal is received, at a respective RF receiver circuit (not shown) which converts the RF signal to an appropriate signal for taking the requested action on the computer screen or in the computer application. It is noted that the RF receiver circuit may be a conventional RF receiver circuit for receiving RF signals. Further, in one embodiment the output, or amplified RF signal may be a 27 MHz signal as is described above.

The present invention advantageously provides a low voltage, low-power consumption, yet highly efficient amplifier system. The biasing subsystem advantageously allows for the use of an amplifier in a non-linear class-C type operation mode that, in turn, provides high efficiency. Moreover, high-efficiency is achieved even with a low-voltage power supply and low-voltage input signal.

Further, the present invention includes an enable function without an additional cost impact. The enable beneficially allows for switching the amplifier OFF when no signal is transmitted. This allows for increasing battery life because battery power is saved when no transmission is required. In addition, using the enable function an RF transmitter system advantageously attains the beneficial functions and features of the present invention using either frequency modulation or amplitude modulation.

In sum, those skilled in the art will appreciate that the present invention may be beneficial in a variety of applications where high efficiency signal transmission and low power consumption would be beneficial. These applications may include, but are not limited to, wireless or remote devices, for example, wireless keyboards, wireless pointing devices, cellular telephones and other one or two-way communication systems or devices.

While particular embodiments and applications of the present invention have been illustrated and described, it is to be understood that the invention is not limited to the precise construction and components disclosed herein and that various modifications, changes and variations which will be apparent to those skilled in the art may be made in the arrangement, operation and details of the method and apparatus of the present invention disclosed herein without departing from the spirit and scope of the invention as defined in the appended claims.

What is claimed is:

1. An amplifier system for generating an amplified radio-frequency signal, the amplifier system comprising:
   a transistor coupled to a low supply voltage;
   a biasing subsystem having a capacitor coupled to receive modulated input signal and a resistor coupled to receive an enable signal, the biasing subsystem for operating the transistor in a non-linear operating area that is greater than zero; and
   a resonant subsystem, coupled to transistor, the resonant subsystem for generating the amplified radio-frequency signal and for removing unwanted harmonics and sub-harmonics.

2. The amplifier system in claim 1, wherein the resonant subsystem is tuned to a frequency of the modulated input signal for generating the amplified radio-frequency signal at a similar frequency.

3. The amplifier system in claim 2, wherein the resonant subsystem is tuned to an even multiple of the frequency of the modulated input signal for generating the amplified radio-frequency signal at a similar even multiple frequency.

4. The amplifier system in claim 1, wherein the modulated input signal is a low voltage signal of at least substantially zero volts peak-to-peak.

5. The amplifier system in claim 1, wherein the low supply voltage is at least 1.0 volts.

6. The amplifier system in claim 1, wherein the transistor is a npn transistor.

7. The amplifier system in claim 1, wherein the transistor is a pnp transistor.

8. The amplifier system in claim 1, wherein the biasing subsystem includes a capacitor, coupled to receive the modulated input signal, and coupled to the transistor and a resistor, coupled to the capacitor and the transistor.

9. The amplifier system in claim 1, wherein the resonant subsystem includes a resonant inductor and a resonant capacitor, the resonant inductor and the resonant capacitor coupled to each other in parallel and coupled to the transistor.

10. A method for generating an amplified radio frequency signal in a radio frequency transmitter system including a low-power amplifier system, the method comprising:
    applying an input oscillator signal to the low-power amplifier system;
    switching the low-power amplifier system to an ON state;
    biasing a transistor close to a threshold voltage for using non-linear properties of the transistor, including at a substantially low input voltage signal;
    amplifying the input oscillator signal;
    eliminating unwanted harmonics and subharmonics from an output signal;
    transmitting the amplified radio frequency signal; and
    switching the low-power amplifier to an OFF state in response to transmission of the amplified radio-frequency signal.

11. The method of claim 10, wherein the substantially low input voltage signal is a substantially zero input voltage signal.

12. The method of claim 10, further comprising waiting for an oscillator steady state, in response to applying the input oscillator signal, before switching the low-power amplifier system.

13. A method for generating an amplified radio frequency in a radio frequency transmitter system including a low-power amplifier system, the method comprising:
    applying an input oscillator signal to the low-power amplifier system and waiting for an oscillator steady state in response to the applied input oscillator signal;
    switching the low-power amplifier system to an ON state;
    biasing a transistor close to a threshold voltage for using non-linear properties of the transistor, including at a substantially low input voltage signal;
    amplifying the input oscillator signal;
    eliminating unwanted harmonics and subharmonics from an output signal;
    transmitting the amplified radio frequency signal; and
    switching the low-power amplifier to an OFF state in response to transmission of the amplified radio-frequency signal.

14. The method in claim 13, wherein the substantially low input voltage signal is a substantially zero input voltage signal.

\* \* \* \* \*